United States Patent [19]

Nakamura

[11] Patent Number: 4,972,580
[45] Date of Patent: Nov. 27, 1990

[54] METHOD FOR CONNECTING ELECTRONIC COMPONENTS WITH DUMMY PATTERNS

[75] Inventor: Koichiro Nakamura, Yokohama, Japan

[73] Assignee: Kabushiki Kaisha Toshiba, Kawasaki, Japan

[21] Appl. No.: 369,623

[22] Filed: Jun. 21, 1989

[30] Foreign Application Priority Data

Jun. 24, 1988 [JP] Japan .................. 63-154911

[51] Int. Cl.$^5$ .............................. H05K 3/34
[52] U.S. Cl. ........................ 29/840; 29/740; 174/88 R; 228/179; 228/2; 357/69
[58] Field of Search ............. 29/840, 740; 156/276, 156/324.9; 228/179, 2, 180.2; 174/88 R; 252/500; 200/5 R; 357/69

[56] References Cited

U.S. PATENT DOCUMENTS

| | | | |
|---|---|---|---|
| 4,261,042 | 4/1981 | Ishiwatari et al. | |
| 4,668,581 | 5/1987 | Luc et al. | 357/69 X |
| 4,731,503 | 3/1988 | Kitanishi | 174/88 R |
| 4,740,657 | 4/1988 | Tsukagoshi et al. | 174/88 R |
| 4,795,079 | 1/1989 | Yamada | 228/179 |
| 4,835,847 | 6/1989 | Kamperman | 29/740 X |

FOREIGN PATENT DOCUMENTS 52-74254  6/1977  Japan .................. 29/840

OTHER PUBLICATIONS

IBM Tech. Discl. Bull., vol. 9, No. 10, Mar., 1967, pp. 1283-1284 by D. O. Johnson, Jr.

*Primary Examiner*—Carl E. Hall
*Assistant Examiner*—Carl J. Arbes
*Attorney, Agent, or Firm*—Cushman, Darby & Cushman

[57] ABSTRACT

To electrically connect a plurality of connecting terminals of an electronic component, e.g., a liquid crystal display device (LCD) to a printed circuit board, a plurality of wiring patterns are first formed on the printed circuit board. These wiring patterns have similar shapes to those of the connecting terminals, and have a signal transmission function. Thereafter, a plurality of dummy patterns are formed outside both outermost wiring patterns on the printed circuit board. These dummy patterns have no signal transmission function. Finally, the connecting terminals of the electronic component are electrically connected via an anisotropically conductive sheet to both the wiring patterns and dummy patterns.

13 Claims, 5 Drawing Sheets

F I G.10
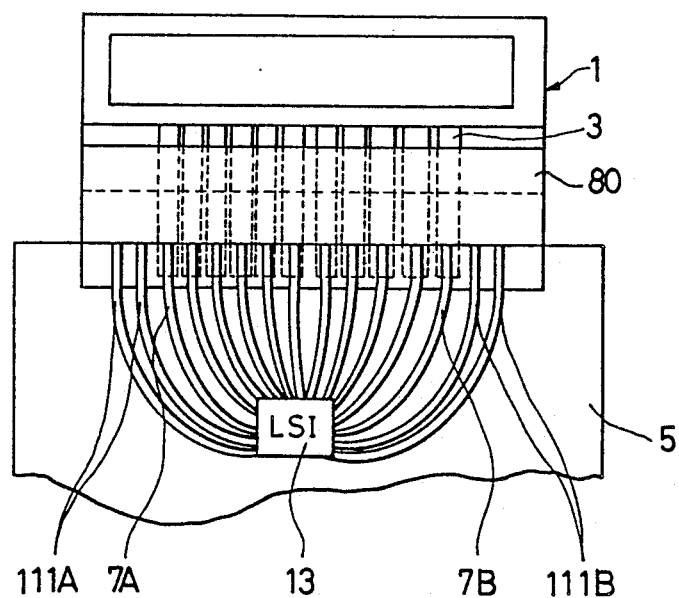

METHOD FOR CONNECTING ELECTRONIC COMPONENTS WITH DUMMY PATTERNS

BACKGROUND OF THE INVENTION

1. Field of the Invention

The present invention relates to a method and an apparatus for connecting an electronic component suitable for use in the case where an electronic component such as a liquid crystal display device having a plurality of connecting terminals juxtaposed with each other at a small pitch is connected to a printed circuit board via an anisotropically conductive sheet by compression bonding.

2. Description of the Related Art

Recently, a liquid crystal display device has come to be widely used as one of the display devices. Making use of their features of being small in thickness and consuming low power, the liquid crystal display devices have been used in watches and electronic calculators and lately, their use mounted on an IC card has been considered.

In connecting a liquid crystal display device to a printed circuit board, there are frequently cases where contact points amounting to 80 or so in number, at a pitch of about 0.4 mm, have to be connected. In such a case, it is very difficult to achieve the connections by ordinary soldering. Therefore, as shown in FIG. 1, such a method as to have an anisotropically conductive sheet 9 sandwiched in-between connecting terminals of the liquid crystal display device 1 and wiring patterns 7 formed on the printed circuit board 5 and connect a pile of these members together by thermal compression bonding. It should be understood that the anisotropically conductive sheet is a sheet having conductivity only in one direction, while having electrical insulating property in all the other directions. A conventional method for such connection is described, for example, in U.S. Pat. No. 4,261,042.

However, when the compression bonding conditions of the wiring patterns 7 are investigated, it is found that the outermost wiring patterns 7A, 7B of the wiring patterns 7 are liable to be subjected to uneven abutting force via the anisotropically conductive sheet 9 as compared with the abutting force on other wiring patterns 7 via the same due to the fact that there are absent any adjoining wiring patterns on their outer sides (on the left-hand side and right-hand side of the outermost wiring patterns 7A, 7B in the figure). As a result, there has been the possibility that electrical conductivities at these connections become insufficient.

SUMMARY OF THE INVENTION

The present invention has been made in an attempt to solve the foregoing problems. Accordingly, an object of this invention is to provide a method for connecting electronic components, thereby preventing an occurrence of insufficient electrical conductivity and ensuring reliable connections.

To achieve the above-described object, a method for electrically connecting an electronic component (1) having a plurality of connecting terminals (3) to a circuit board (5), according to the invention, comprises the steps of:

forming a plurality of wiring patterns (7:7A:7B) on the circuit board (5), each of these wiring patterns having a similar shape to that of the respective connecting terminals (3) and a signal transmission function;

forming dummy patterns (11A:11B) outside both outermost wiring patterns (7A:7B) on the circuit board (5), these dummy patterns (11A:11B) having no signal transmission function; and, electrically connecting these connecting terminal(s) of the electronic component (1) via an anisotropically conductive sheet (9) to both those wiring patterns (7:7A:7B) and dummy patterns (11A:11B) under predetermined pressure.

Furthermore, an electronically connecting apparatus, according to the invention, comprises:

an electronic component (1) having a plurality of connecting terminals (3);

a circuit board (5) to be electrically and mechanically connected to said electronic component (1);

a plurality of wiring patterns (7:7A:7B) formed on the circuit board (5), each of these wiring patterns having a similar shape to that of the respective connecting terminals (3) and also a signal transmission function;

dummy patterns (11A:11B) formed outside both outermost wiring patterns (7A:7B) on said circuit board (5), these dummy patterns (11A:11B) having no signal transmission function; and, an anisotropically conductive sheet (9) sandwiched between said connecting terminals (3) of the electronic component (1) and both said wiring patterns (7:7A:7B) and dummy patterns (11A:11B) under predetermined pressure.

BRIEF DESCRIPTION OF THE DRAWINGS

For a better understanding of the present invention, reference is made to the following in conjunction with reference to the accompanying drawings, in which:

FIG. 2 and FIG. 3 are for showing an embodiment of the present invention applied to connection of a liquid crystal display device, wherein FIG. 2 is a plan view of the components in connection and FIG. 3 is a sectional view taken along line $A_1$—$A_1$ in FIG. 2;

FIG. 4 to FIG. 6 are for showing a concrete example of the liquid crystal display device connected by the method as shown in FIG. 2 and FIG. 3 being applied to, for example, a multi-functional IC card, wherein FIG. 4 is a plan view of the IC card, and FIG. 5 and FIG. 6 are sectional views taken along lines $A_2$—$A_2$ and B—B in FIG. 4, respectively;

FIG. 10 is a plan view for illustrating a bridge board connecting method.

DETAILED DESCRIPTION OF THE PREFERRED EMBODIMENTS

Basic Idea

A basic idea of the present invention will now be summarized.

In attaining electrical conductivities in connections of a plurality of connecting terminals arranged on an electronic component to wiring patterns arranged on a printed circuit board in substantially the same shape as the shape of the arrangement of the connecting terminals by compression bonding via an anisotropically conductive sheet, dummy patterns are provided at the positions on the outer sides of the outermost wiring patterns of the above mentioned wiring patterns, the dummy patterns having no signal transmission function with the electronic component, and in actual connection, the compression bonding is performed with the dummy patterns used as outermost wiring patterns. By so doing, at the time of the compression bonding, the abutting force between all the wiring patterns except the dummy patterns, that is, all the wiring patterns for signal transmission, and the anisotropically conductive sheet becomes uniform all over the printed circuit board.

In other words, by providing extra wiring patterns (dummy patterns) on a printed circuit board on the outer sides of the outermost wiring patterns for signal transmission, it is intended to have uniform abutting force applied to all the wiring patterns having the signal transmission function at the time of compression bonding.

First Connecting Method

Figure 2:
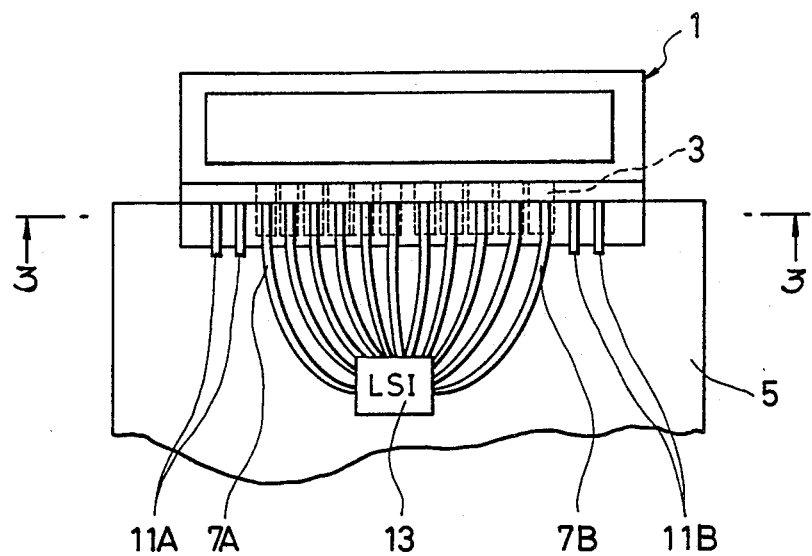
Figure 3:
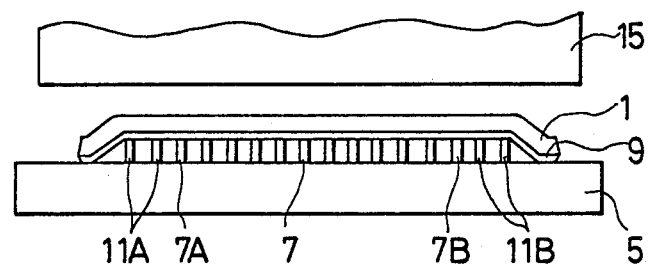

FIG. 2 and FIG. 3 show a connecting method according to a first embodiment, i.e., the case where the present invention has been applied to connection of a liquid crystal display device. FIG. 2 is a plan view showing the components in connection, and FIG. 3 is a sectional view taken along line $A_1$—$A_1$ in FIG. 2. This embodiment is characterized in that there are provided dummy patterns 11A and 11B at the positions on both outer sides of signal transmitting wiring patterns 7 (i.e., outside the left-hand and right-hand outermost wiring patterns 7A and 7B) formed on a printed circuit board 5 for attaining electrical conductivities in connections of connecting terminals 3 formed, for example, in an ITO (Indium Tin Oxide) film of a liquid crystal display device 1 to the wiring patterns 7 via an anisotropically conductive sheet 9. Then, at the time of the connection, the anisotropically conductive sheet 9 is bonded by thermal compression to the dummy patterns 11A, 11B as well as the other wiring patterns 7, and thereby, the abutting force at the time of the thermal compression bonding between the anisotropically conductive sheet 9 and the outermost wiring patterns 7A (on the left-hand side) and 7B (on the right-hand side) is specifically made equal to that between the same and the wiring patterns 7. In other words, the abutting force between the entire signal transmitting wiring patterns 7, 7A, 7B and the anisotropically conductive sheet 9 is made uniform. It should be noted that as previously described, these dummy patterns 11A, 11B do not have a signal transmission function, but have the above-mentioned mechanical function.

As the printed circuit board 5, a glass epoxy having a thickness of 0.2 mm, for example, may be used, and as both the signal transmitting wiring patterns 7, 7A, 7B and the dummy patterns 11A, 11B, gold-plated copper patterns being about 30 micrometers thick, for example can be used.

Figure 1:
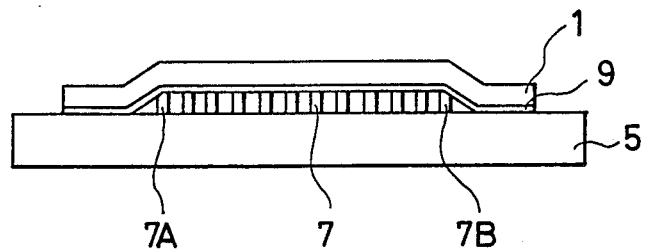
FIG. 1 is an illustration for showing a prior art connecting method.

In FIG. 2 and FIG. 3, reference numeral 13 denotes an LSI (large scale integration), for example, for display control of the liquid crystal display device 1 connected to the printed circuit board 5 and reference numeral 15 denotes a thermal compression bonding tool which is used for the connecting process. The parts corresponding to those in the above-described FIG. 1 are denoted by corresponding reference numerals and detailed description of these is omitted.

Second Connecting Method

Figure 4:
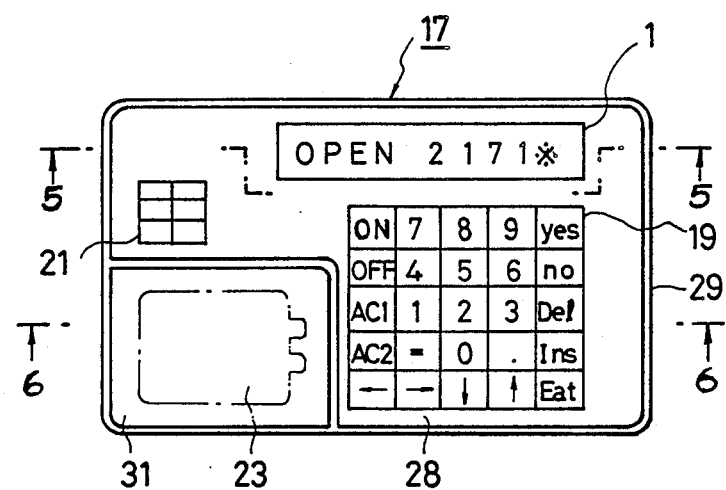
Figure 5:
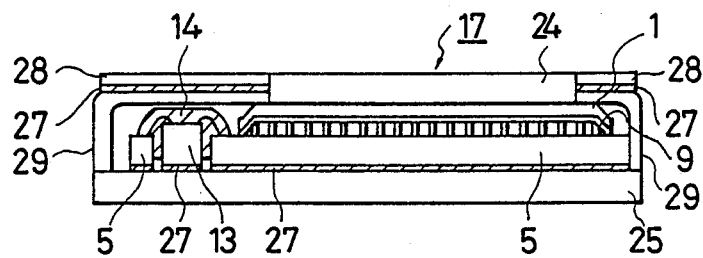
Figure 6:
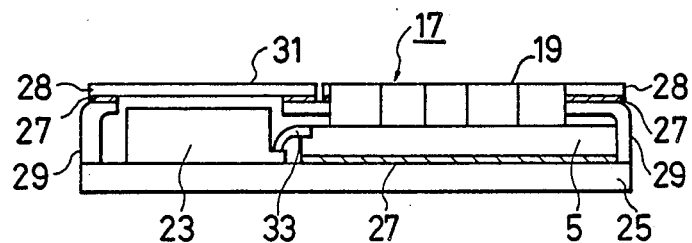

FIG. 4 to FIG. 6 are for showing a concrete example of the liquid crystal display device 1 connected by the method as shown in the first embodiment of FIG. 2 and FIG. 3 applied to, for example, a multi-functional IC card 17. FIG. 4 is a plan view of the IC card 17, FIG. 5 and FIG. 6 are sectional views taken along lines $A_2$—$A_2$ and B—B in FIG. 4, respectively.

In the IC card 17 according to the preferred embodiment, replacement of a built-in battery 23 can be performed by removing only a battery covering sheet 31 provided separately from a main covering sheet 28 for covering an opening for replacing the used battery, made in an armoring board 29. As a result, the need in replacing an used battery for removing an entire covering sheet including the main covering sheet portion for electrodes for key contacts, the transparent portion for the liquid crystal display device, and the like, as is the case with the conventional example, can be eliminated. Thus, this arrangement has an advantage that dust or the like can be prevented from penetrating into the portions of a keyboard 19 or the liquid crystal display device 1 at the time of the battery replacement. Referring to FIGS. 5 and 6, reference numeral 33 denotes a contact for the battery for connecting the battery 23 with power supplying pattern of the printed circuit board 5. Furthermore, reference numeral 14 indicates a resin for sealing LSI 13, reference numeral 21 denotes a contact section for the IC card 17, reference numeral 24 represents a protective transparent plate for LCD 1, reference numeral 25 indicates a rear armoring board, and reference numeral 27 denotes an adhesive agent for LSI 13.

Third Connecting Method

A third embodiment of connecting method of the present invention will be described with reference to FIG. 7 below.

Figure 7:
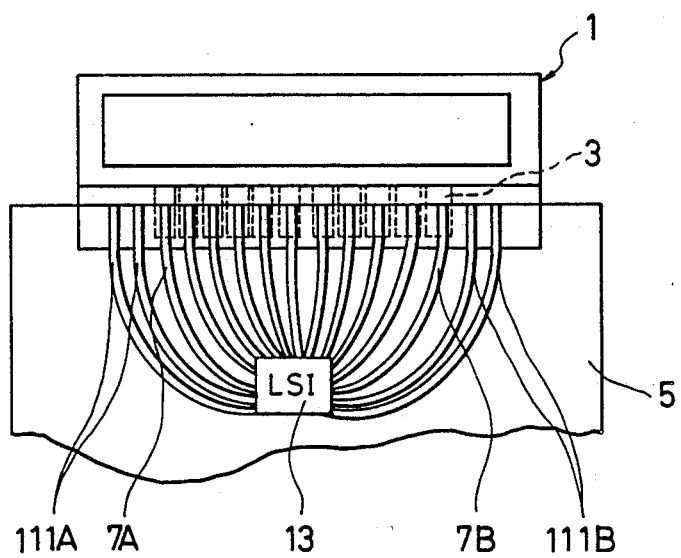
FIG. 7 is a plan view for explaining a connecting method according to a third embodiment.

As apparent from FIG. 7, dummy patterns 111A and 111B are connected with ground lines of the LSI 13, whereby these dummy patterns 111A, 111B function as the ground lines in addition to their inherent function for making uniform the abutting force at the time of compression bonding.

Since the third method for forming and connecting the dummy patterns 111A, 111B are the same as those in the previous embodiment of FIG. 2 and FIG. 3, no further explanation is made here.

Modifications

The present invention is not limited to the above-described embodiments, but various changes and substitutions may be made in the invention.

For example, although the electronic component as the object for connection in the above-described embodiments was a liquid crystal display device, the component is not limited to it. The present invention may be applied to any object for connectin only if it has a plurality of connecting terminals arranged at a narrow pitch and its connection to a circuit board is performed by compression bonding via an anisotropically conductive sheet.

Figure 8:
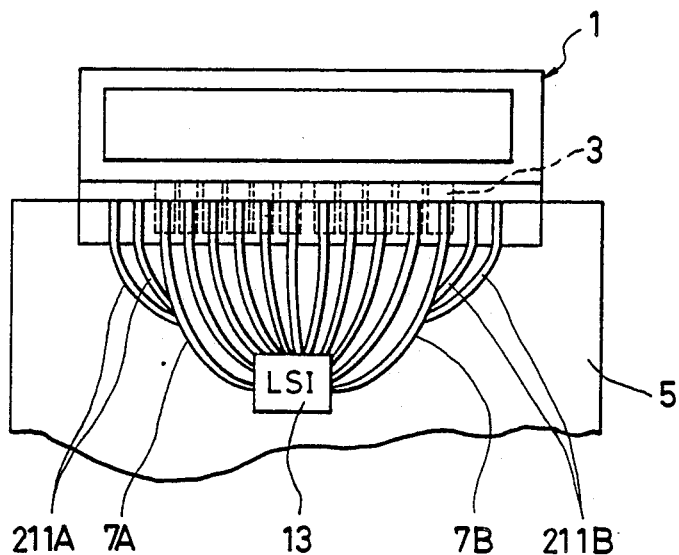
FIGS. 8 and 9 are plan views for representing modified connecting methods.
Figure 9:
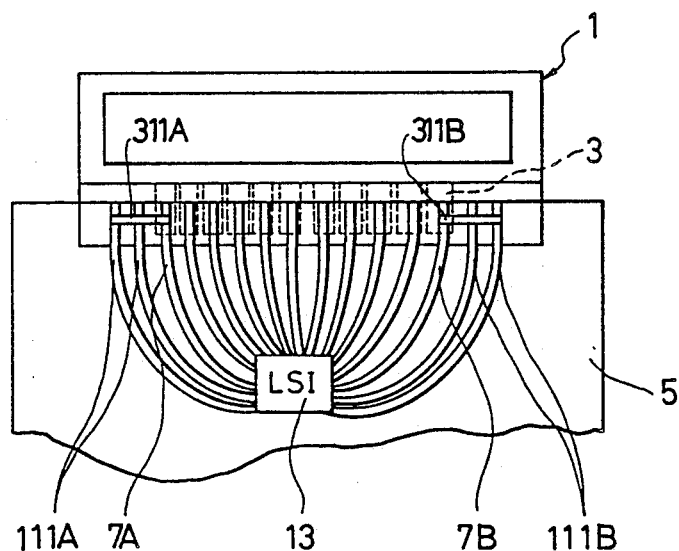

Then as shown in FIG. 8, a pair of two dummy patterns 211A and 211B which are relatively longer than two dummy patterns 11A, 11B shown in FIG. 2, may be formed. Also, as illustrated in FIG. 9, a pair of bridge patterns 311A and 311B may be formed for bridging two adjoining dummy patterns 11A or 111B. As a result, the signal transmission functions may be further improved.

Although the connection in the above-described embodiments was made via an anisotropically conductive sheet, the present invention may be also applied to the case where electrical conductivities in connections are attained via a known bridge board. As represented in FIG. 10, the liquid crystal display device 1 may be connected via a bridge board 80 to the printed circuit board 5 where the dummy patterns 111A and 111B are formed. It should be noted that such a bridge board 80 is known in the field, but a combination between the printed circuit board and bridge board constitutes one of the features according to the invention.

Further, the number of the dummy patterns may be other than two for each outer side as in the above-described embodiments. Namely, one thereof may be provided on each outer side, or three or more thereof may of course be provided on each side.

According to the present invention as described so far in detail, the concentration of pressure on the outermost wiring patterns at the time of thermal compression bonding, as is the case with the conventional connecting method without using any dummy pattern, can be eliminated and the compression bonding force and thermal conduction can be made uniform all over the wiring patterns, and therefore, the insufficient electrical conductivities can be avoided to achieve the perfect electrical connections.

What is claimed is:

1. A method for electrically connecting an electronic component having a plurality of connecting terminals to a circuit board, comprising the steps of:
    forming a plurality of wiring patterns on said circuit board, each of said wiring patterns having a similar shape to that of the respective connecting terminals and also a signal transmission function;
    forming dummy patterns outside both outermost wiring patterns on said circuit board; and
    electrically connecting said connecting terminals of the electronic component via an anisotropically conductive sheet to both said wiring patterns and dummy patterns under predetermined pressure.

2. A connecting method as claimed in claim 1, wherein said connecting terminals of the electronic component are electrically connected via said anisotropically conductive sheet to both said wiring patterns and dummy patterns under a thermal compression.

3. A connecting method as claimed in claim 1, wherein a length of the respective dummy patterns in a longitudinal direction thereof is considerably shorter than that of the respective connecting patterns.

4. A connecting method as claimed in claim 3, wherein two pieces of said dummy patterns are formed outside both said outermost connecting patterns, respectively.

5. A connecting method as claimed in claim 4, wherein said electronic component is a liquid crystal display device, said liquid crystal display device being electrically connected via said connecting terminals, anisotropically conductive sheet, and wiring patterns to a large-scale integrated circuit mounted on the circuit board.

6. A connecting method as claimed in claim 1, wherein said dummy patterns are electrically connected to each others and also to said outermost connecting patterns respectively so as to form signal transmission dummy patterns.

7. A connecting method as claimed in claim 1, wherein a bridge board is interposed between said connecting terminals of the electronic component and said circuit board.

8. A method for electrically connecting an electronic component having a plurality of connecting terminals to a circuit board, comprising the steps of:
    forming a plurality of wiring patterns on said circuit board, each of said wiring patterns having a similar shape to that of the respective connecting terminals and also a signal transmission function;
    forming dummy patterns each having the substantially same length as that of the respective wiring patterns in a longitudinal direction thereof, outside both outermost wiring patterns on the circuit board, said dummy patterns functioning as the same signal transmission as said wiring patterns; and,
    electrically connecting said connecting terminals of the electronic component via an anisotropically conductive sheet to both said wiring patterns and dummy patterns under predetermined pressure.

9. A connecting method as claimed in claim 8, wherein said connecting terminals of the electronic component are electrically connected via said anisotropically conductive sheet to both said wiring patterns and dummy patterns under a thermal compression.

10. A connecting method as claimed in claim 8, wherein two pieces of said dummy patterns are formed outside both said outermost connecting patterns, respectively.

11. A connecting method as claimed in claim 10, wherein said electronic component is a liquid crystal display device, said liquid crystal display device being electrically connected via said connecting terminals, anisotropically conductive sheet, and wiring patterns to a large-scale integrated circuit mounted on the circuit board.

12. A connecting method as claimed in claim 8, wherein said dummy patterns are electrically connected via bridge patterns to each other.

13. A connecting method as claimed in claim 8, wherein a bridge board is interposed between said connecting terminals of the electronic component and said circuit board.

* * * * *